United States Patent [19]
Thorpe

[11] Patent Number: 5,919,379
[45] Date of Patent: Jul. 6, 1999

[54] COPPER-FOIL HAVING A PROTECTIVE LAYER AND COPPER-CLAD LAMINATES USING SAME

[75] Inventor: John E. Thorpe, Palos Verdes Estates, Calif.

[73] Assignee: Foil Technology Development Corporation, Burlington, N.J.

[21] Appl. No.: 08/996,092

[22] Filed: Dec. 22, 1997

[51] Int. Cl.$^6$ ..................................................... H01B 13/00
[52] U.S. Cl. .............................. 216/13; 216/95; 216/100; 216/105; 216/106; 205/50; 428/544; 428/607; 428/615
[58] Field of Search .................................. 205/50; 216/2, 216/13, 20, 33, 35, 36, 41, 55, 95, 100, 105, 106; 428/544, 615, 607

[56] References Cited

U.S. PATENT DOCUMENTS

| | | | |
|---|---|---|---|
| 3,844,857 | 10/1974 | Chiang | 156/8 |
| 3,936,548 | 2/1976 | Konicek | 427/405 |
| 4,525,240 | 6/1985 | Elias et al. | 156/659.1 |
| 5,366,814 | 11/1994 | Yamanishi et al. | 428/607 |
| 5,403,672 | 4/1995 | Urasaki et al. | 428/607 |

*Primary Examiner*—Richard Bueker
*Assistant Examiner*—Alva C Powell
*Attorney, Agent, or Firm*—Finnegan, Henderson, Farabow, Garrett & Dunner, L.L.P.

[57] ABSTRACT

Copper foil having a matte surface and an opposite shiny surface, the shiny surface having thereon a protective metallic coating comprised of a first protective metallic layer, preferably iron, electrodeposited on the shiny surface and a second metallic layer, preferably zinc, electrodeposited on the first layer, the metallic coating be chemically removable without damage to the copper foil and the second metallic layer being softer than the first metallic layer. The matte surface of the copper foil can be bonded to a dielectric material, and the protective metallic coating can be removed from the shiny surface by etching.

6 Claims, No Drawings

COPPER-FOIL HAVING A PROTECTIVE LAYER AND COPPER-CLAD LAMINATES USING SAME

FIELD OF THE INVENTION

This invention relates to the production of copper foil having a protective metallic coating thereon, to such foil, and to copper-clad laminates made with such foil.

BACKGROUND OF THE INVENTION

In the production of copper clad laminates for use in the manufacture of printed circuit boards it is not uncommon that, during the laminating process, the outer copper surface of the finished laminate is damaged by the entrapment of particulate matter between it and a pressure applicator. Pressure can be applied by a roller in continuous laminating or a hardened steel plate in press laminating.

The contamination can arise from resin particles used in the bonding process or dust particles lying on the copper at the time pressure is applied. The present of such particles, which are usually of microscopic dimensions, causes either indents on the surface of the copper layer or spots of resin melted onto the surface.

This contamination can interfere with the efficient production of circuit boards and is viewed with concern by the industry as it can cause rejects of the laminate before use and/or substantial pre-use surface preparation before the laminate can be processed into a printed circuit. Such surface preparation can be by brushing and pre-etching of the copper layer before processing.

The effect of this form of surface contamination of the copper layer is further complicated by the presence on the copper itself of an anti-oxidant layer put there during its manufacture. Such a layer is described in U.S. Pat. No. 3,853,716, which proposes an electrolytically deposited layer of chrome. Such layers are applied by the copper foil manufacturers so that during storage and laminating the copper layer is prevented from oxidizing through exposure to the atmosphere or during the laminating process where it is subjected to heat.

In order to be effective against oxidation such layers need to be of significant thickness and the consequence of this, plus the other contamination referred to above, is that the surface preparation of the laminate required before printed circuit board production is vigorous and potentially harmful to the laminate. This is particularly the case in so-called thin laminates (0.05 to 0.75 mm thick) where the risk of creasing the material is high. Where such thin laminate is also clad with thin copper (12–20 μm thick) the damage risk is even greater.

SUMMARY OF THE INVENTION

The present invention provides a product for lamination to dielectric material in the production of printed circuit boards, the product comprising an electrodeposited copper foil having on one side a matte surface for bonding to the dielectric material and having on the opposite side a shiny surface covered by a temporary protective metallic coating, formed of a metal other than copper, which can be removed chemically without harming the copper foil and which is sufficiently thick and, over at least part of its thickness, sufficiently soft to reduce or prevent mechanical damage of the shiny surface of the copper foil by surface contaminating particles during lamination under heat and pressure.

Preferably, the metallic containing comprises a first metallic layer (preferably of iron) on the shiny surface of the copper foil and a second metallic layer (preferably of zinc) on the first layer, the first layer being more easily chemically removable and the second layer being softer than the first layer.

The invention also provides a laminate comprising a product as described above having its matte surface bonded to a dielectric material.

The invention further provides a process for producing printed circuit boards using the above laminate, which includes the step of chemically removing the above metallic coating without harming the copper foil, e.g. by dissolving the coating in hot dilute sulphuric acid.

DESCRIPTION OF THE PREFERRED EMBODIMENTS OF THE INVENTION

It is possible to diminish and/or eliminate the defects and difficulties in the prior art methods described above by providing copper foil with an outer protective coating comprising a first layer of iron electrodeposited on the shiny surface of the copper followed by a second layer of zinc electrodeposited in the layer of iron. These two layers may be provided on electrolytic copper foil manufactured and treated by techniques such as described in U.S. Pat. No. 1,978,037 and U.S. Pat. No. RE 30,180, both of which are incorporated herein by reference.

When applied to the treated copper foil this metallic coating can provide the following advantages:

1) It protects the shiny side of the copper foil from damage due to handling and from atmospheric oxidation during the laminating process.

2) The soft zinc layer significantly reduces pitting of the underlying copper layer caused by microparticles on the surface because the zinc layer cushions the initial impact.

3) Resin dust entrapped on the surface is melted onto the zinc not the copper.

4) No other anti-oxidation layer is required on the copper.

5) Immediately before use the metal layer can be removed quickly by means of hot sulphuric acid, during which process the vigorous gassing that takes place dislodges all traces of surface contamination, leaving a surface ready for processing that is pure copper free of all the typical contamination found on traditional laminates.

The present invention is further described with reference to the following example of a preferred embodiment of the invention.

EXAMPLE

The steps of depositing the iron and zinc layers were carried out in sequence with the bond-enhancing treatment normally carried out on copper foil and described, for example, in U.S. Pat. Nos. 3,857,681, 3,293,109 and RE 30,180, which are incorporated herein by reference. This was done by interposing additional baths electrochemical treating steps between the processes as described in British Patent No. 1 413 494 and the final drying and re-reeling operation. The additional baths were operated without difficulty as an extension to known processes, and samples of material in accordance with the present invention have been produced this way from baths and electrodeposited conditions as described below. Electrolytic copper foil having a bond-enhancing dual-layer of copper electrodeposited on the matte side of the foil was passed through the following baths in sequence to electrodeposit on the shiny side of the foil an iron layer, followed by a zinc layer electrodeposited on the iron layer.

| Iron Bath | |
| --- | --- |
| FeSO$_4$(NH$_4$)$_2$SO$_4$.6H$_2$O | 350 g/l |
| pH | 3 |
| Temperature | Ambient |
| Current Density | 20 A/ft$^2$ (2.2 A/dm$^2$) |
| Anode | Mild Steel |
| Time | 15 seconds |
| Zinc Bath | |
| ZnSO$_4$.7H$_2$O | 200 g/l |
| Sb | 500 mg/l |
| pH | 3 |
| Temperature | Ambient |
| Current Density | 20 A/ft$^2$ (2.2 A/dm$^2$) |
| Anode | 300 Series Stainless Steel |
| Time | 20 seconds |

Copper foil treated in baths according to the above conditions exhibited on its shiny side a grey coating of zinc uniformly dispersed on its surface.

This copper was converted into a copper-clad laminate by bonding the matte side of the foil to a conventional pre-impregnated glass fabric using a hot platen press.

Before the copper was put into the press the outer zinc surface was liberally dusted with resin particles, such particles being representative of an extreme case of surface contamination in the production of such laminates. After pressing, the resin dust was seen to have melted and smeared onto the surface of the zinc layer.

The laminate sample was then etched for 2 minutes in 10% by volume H$_2$SO$_4$ at 80° C. After further cleaning for 2 minutes in an ultrasonically agitated bath made up with 10% H$_2$SO$_4$+2% H$_2$O$_2$ at ambient temperature, the plate was washed and examined. The examination showed a copper surface completely free of all resin contamination and ideal for the production of fine line printed circuit boards.

Alternative to the zinc layer provide din the example above the zinc layer may be replaced with a layer of copper either in the form of pure metallic copper or copper/copper oxide. In either case, after lamination, such a copper layer can be chemically removed with a typical ammoniacal etch which does not attack the underlying iron layer. This permits a vigorous etching without disturbing the integrity of the copper foil surface below the iron layer, which can be removed quickly and easily with weak sulphuric acid before processing of the board continued in the traditional manner.

Similarly it is be possible to replace the iron layer with a layer of nickel, silver, tin, lead, or other metal which can be removed chemically by a process that does not interfere with the underlying copper foil.

By variations to plating and etching conditions, changes can be made to both of these stages and the conditions quoted are merely representative of the process.

The present process provides copper foil with a shiny side coating which protects the copper from contamination during laminating and until such surface is ready for use in the manufacture of printed circuit board. The coating is provided by the application or the deposition of a metallic layer which can be removed chemically without harming the underlying copper and another layer of soft metal sufficiently thick to absorb the impact of resin particles or other particulate matter without damaging the underlying copper foil surface during lamination under heat and pressure.

Variations and modifications falling within the spirit of the present invention may become apparent to those skilled in the art, and the scope of the invention is to be determined by the appended claims and their equivalents.

What is claimed is:

1. Copper foil having a matte surface and an opposite shiny surface, the shiny surface having thereon a protective metallic coating comprised of a first protective metallic layer formed of a metal other than copper and electrodeposited on the shiny surface and a second metallic layer electrodeposited on the first layer, the metallic coating being chemically removable from the shiny surface without damage to the copper foil and the second metallic layer being softer than the first metallic layer.

2. The copper foil of claim 1, wherein the first layer is formed a metal selected from the group consisting of iron, nickel, silver, tin, lead, and alloys thereof, and the second layer is formed of a metal selected from the group consisting of zinc, copper, alloys thereof and copper oxide.

3. The copper foil of claim 1, wherein the first layer is formed of iron and the second layer is formed of zinc.

4. The copper foil of claim 1, wherein the matte surface is bonded to a dielectric material to form a laminate.

5. A process for producing printed circuit boards using the laminate of claim 4, wherein the metallic coating is chemically removed from the shiny surface.

6. The process of claim 5 wherein the chemical removal is conducted by etching.

* * * * *